US012627216B2

(12) United States Patent　　　(10) Patent No.:　US 12,627,216 B2

Kawai　　　　　　　　　　　　　　　(45) Date of Patent:　May 12, 2026

(54) DRIVING CIRCUIT FOR SWITCHING ELEMENTS WITH CONTROLLABLE DRIVING CURRENT

(71) Applicants: KABUSHIKI KAISHA TOSHIBA, Tokyo (JP); Toshiba Electronic Devices & Storage Corporation, Tokyo (JP)

(72) Inventor: Shusuke Kawai, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 447 days.

(21) Appl. No.: 17/942,535

(22) Filed: Sep. 12, 2022

(65) Prior Publication Data

US 2023/0299657 A1　　Sep. 21, 2023

(30) Foreign Application Priority Data

Mar. 18, 2022　(JP) ................................. 2022-044591

(51) Int. Cl.
| | |
|---|---|
| *H02M 1/08* | (2006.01) |
| *H02M 7/5387* | (2007.01) |
| *H02P 27/06* | (2006.01) |
| *H03K 17/082* | (2006.01) |

(52) U.S. Cl.
CPC .......... *H02M 1/08* (2013.01); *H02M 7/5387* (2013.01); *H02P 27/06* (2013.01); *H03K 17/0822* (2013.01)

(58) Field of Classification Search
CPC ....... H02M 1/08; H03K 17/08; H03K 17/082; H03K 17/0822
See application file for complete search history.

(56) References Cited

U.S. PATENT DOCUMENTS

| | | | |
|---|---|---|---|
| 10,554,202 B2 | 2/2020 | Nomura | |
| 11,894,837 B2 | 2/2024 | Matsubara | |
| 2007/0200613 A1* | 8/2007 | Ishikawa | .............. H03K 17/168 |
| | | | 327/427 |
| 2018/0062633 A1* | 3/2018 | Nomura | .................. H02M 1/08 |

(Continued)

FOREIGN PATENT DOCUMENTS

| | | |
|---|---|---|
| JP | 2014-128053 A | 7/2014 |
| JP | 2018-038174 A | 3/2018 |
| JP | 2021-191088 A | 12/2021 |

OTHER PUBLICATIONS

Camacho et al., "A Novel Active Gate Driver for Improving SiC MOSFET Switching Trajectory", vol. 64, No. 11, Nov. 2017, 11 pages.

(Continued)

*Primary Examiner* — Monica Lewis
*Assistant Examiner* — Jye-June Lee
(74) *Attorney, Agent, or Firm* — Foley & Lardner LLP

(57) ABSTRACT

In one embodiment, electronic circuitry includes a driving circuit that is configured to: supply a driving current to a control terminal of a first switching element; and increase the driving current in accordance with a first time at which a current flowing through a second switching element connected to a first terminal or a second terminal of the first switching element becomes 0.

18 Claims, 16 Drawing Sheets

(56) References Cited

U.S. PATENT DOCUMENTS

| | | | | |
|---|---|---|---|---|
| 2018/0083610 A1* | 3/2018 | Ishii | ........................ | H02M 1/08 |
| 2018/0269869 A1 | 9/2018 | Mukhopadhyay | | |
| 2018/0316344 A1* | 11/2018 | Matsubara | ......... | H03K 17/0822 |
| 2019/0348979 A1* | 11/2019 | Kaneda | ................... | H02M 1/08 |
| 2021/0376826 A1* | 12/2021 | Matsubara | ......... | H03K 17/0822 |
| 2022/0182052 A1* | 6/2022 | Heckroth | ............... | H02M 1/08 |

OTHER PUBLICATIONS

Jeremy J. O. Dalton et al., "Shaping Switching Waveforms in a 650 V GaN FET Bridge-Leg Using 6.7 GHz Active Gate Drivers", 2017, p. 1983-1989, 7 pages.
Koutarou Miyazaki et al., "General-Purpose Clocked Gate Driver IC with Programmable 63-Level Drivability to Optimize Overshoot and Energy Loss in Switching by a Simulated Annealing Algorithm", IEEE Trans. on Industry Application, vol. 53, No. 3, May/Jun. 2017, 8 pages.
Lars Middelstaedt et al. "Direct Approach of Simultaneously Eliminating EMI-Critical Oscillations and Decreasing Switching Losses for Wide Bandgap Power Semiconductors", vol. 34, No. 11, Nov. 2019, 5 pages.
Y. Yang et al. "A Novel Active Gate Driver for Improving Switching Performance of High-Power SiC MOSFET Modules", vol. 34, No. 8, Aug. 2019, 13 pages.
JP Office Action for Japanese Patent Application No. 2022-044591 issued on Feb. 21, 2025 (8 pages).

* cited by examiner

DRIVING CIRCUIT FOR SWITCHING ELEMENTS WITH CONTROLLABLE DRIVING CURRENT

CROSS REFERENCE TO RELATED APPLICATIONS

This application is based upon and claims the benefit of priority from the prior Japanese Patent Application No. 2022-044591, filed on Mar. 18, 2022, the entire contents of which are incorporated herein by reference.

FIELD

Embodiments described herein generally relate to electronic circuitry and an electronic system.

BACKGROUND

In the power electronics field, semiconductor switching elements such as a metal oxide semiconductor field effect transistor (MOSFET) and an insulated gate bipolar transistor (IGBT) are used. A circuit including such a switching element can achieve a reduction of power loss by increasing the speed of switching operation of the element.

However, increasing the speed of switching operation of the element causes current ringing during turn-on. Such current ringing not only causes noise but also accelerates degradation of the element.

There is a technique for obtaining a driving current waveform that allows to reduce current ringing of a switching element, power loss, and the like by using an optimization method based on a simulated annealing algorithm.

BRIEF DESCRIPTION OF THE DRAWINGS

FIG. 3 is an equivalent circuit during a first switching element turns-on;

FIG. 4 is a timing chart for describing operation during the first switching element turns-on;

DETAILED DESCRIPTION

Figure 1:
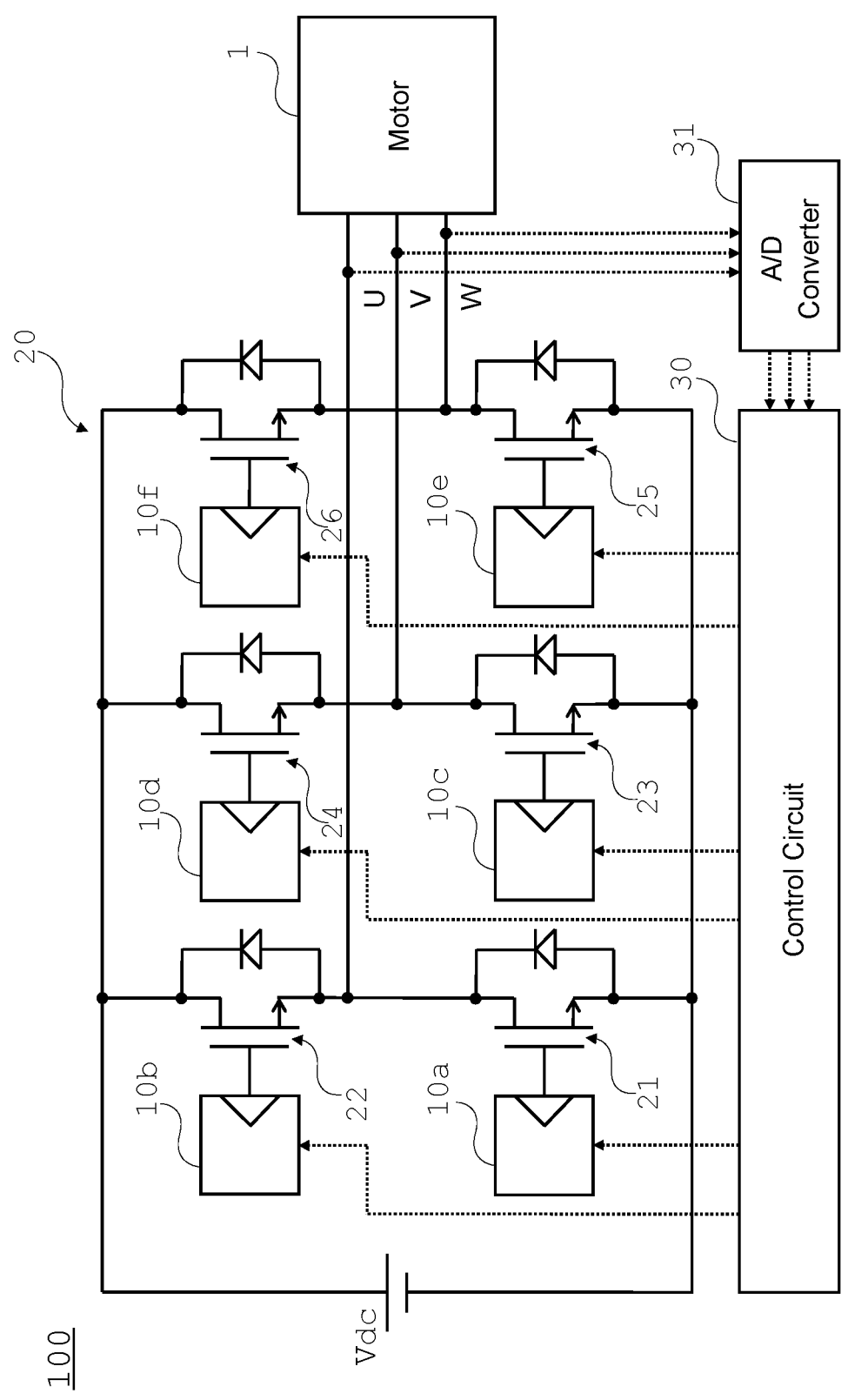
FIG. 1 illustrates a configuration of a motor control system according to a first embodiment.

Hereinafter, embodiments will be described with reference to attached drawings. The same or corresponding elements are denoted by the same reference numerals in the drawings and detailed description thereof will be omitted appropriately.

In general, according to one embodiment, electronic circuitry includes a driving circuit that is configured to: supply a driving current to a control terminal of a first switching element; and increase the driving current in accordance with a first time at which a current flowing through a second switching element connected to a first terminal or a second terminal of the first switching element becomes 0.

In addition, according to another embodiment, electronic circuitry includes a driving circuit configured to: supply a driving current to a control terminal of a first switching element; and reduce the driving current of the first switching element in a second period between a first time and a second time, the first time being when a current flowing through a second switching element becomes 0, the second switching element being connected to a first terminal or a second terminal of the first switching element, the second time being when a current flowing through the first switching element starts increasing.

First Embodiment

FIG. 1 illustrates a configuration of an electronic system 100 according to a first embodiment. The electronic system 100 comprises: a three-phase AC motor 1 that serves as a load; a DC power supply Vdc; switching elements 21 to 26 that constitute a three-phase inverter circuit 20; and driving circuits 10a to 10f that drive the switching elements 21 to 26, respectively. In addition, the electronic system 100 comprises: a control circuit 30 that controls the driving circuits 10a to 10f; and an analog-to-digital (A/D) converter 31. The electronic system 100 is configured to control the operation of the motor 1.

The switching element 21 and the switching element 22 are N-channel MOSFETs and each has a drain terminal as a first terminal, a source terminal as a second terminal, and a gate terminal as a control terminal. The switching element 21 and the switching element 22 constitute an arm pair of U phase of the inverter circuit 20. The driving circuit 10a controls a gate current that is a driving current for the switching element 21, to control the switching operation of the switching element 21, i.e. the turning on and turning off thereof. The driving circuit 10b controls a gate current of the switching element 22, to control the switching operation of the switching element 22.

Similarly, the switching element 23 and the switching element 24 are N-channel MOSFETs. The switching element 23 and the switching element 24 constitute an arm pair of V phase of the inverter circuit 20. The driving circuit 10c controls a gate current of the switching element 23, to control the switching operation of the switching element 23. The driving circuit 10*d* controls a gate current of the switching element 24, to control the switching operation of the switching element 24.

Similarly, the switching element 25 and the switching element 26 are N-channel MOSFETs. The switching element 25 and the switching element 26 constitute an arm pair of W phase of the inverter circuit 20. The driving circuit 10*e* controls a gate current of the switching element 25, to control the switching operation of the switching element 25. The driving circuit 10*f* controls a gate current of the switching element 26, to control the switching operation of the switching element 26.

The A/D converter 31 converts a current value of each of U phase, V phase and W phase of the motor 1 into a digital signal, and outputs it to the control circuit 30. The control circuit 30 provides each waveform information of a gate current, which is driving current of each of the switching elements 21 to 26, to respective each of the driving circuits 10*a* to 10*f* of the switching elements 21 to 26, based on a current value of each phase of the motor 1 received from the A/D converter.

Figure 2:
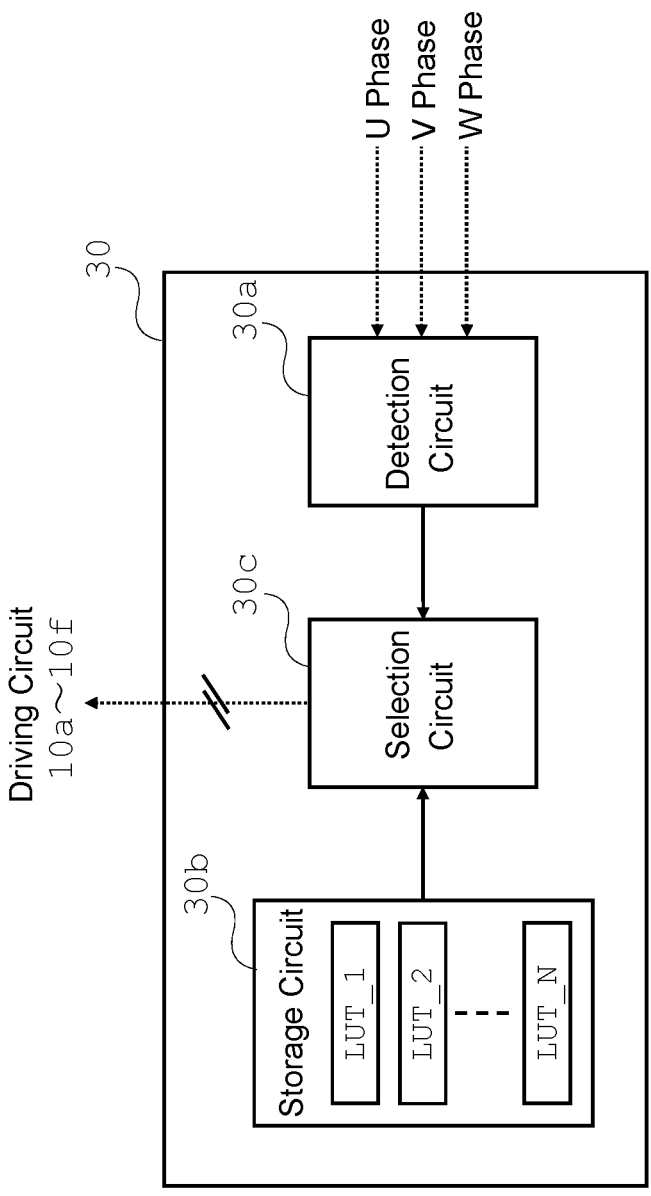
FIG. 2 illustrates an internal configuration of a control device.

FIG. 2 illustrates an internal configuration of the control circuit 30. The control circuit 30 comprises a detection circuit 30*a*, a storage circuit 30*b* including a plurality of lookup tables (LUT_1 to LUT_N) and a selection circuit 30*c*. The detection circuit 30*a* detects the operating states of the switching elements 21 to 26 based on the current value of each of U phase, V phase and W phase of the motor 1 received from the A/D converter 31. Alternatively, the detection circuit 30*a* may detect the operating states of the switching elements 21 to 26 based on temperature received from a temperature sensor (not illustrated) provided within the motor 1. Further alternatively, the detection circuit 30*a* may detect the operating states of the switching elements 21 to 26 based on a signal received from a microcomputer for control (not illustrated) in addition or instead of the A/D converter 31.

Otherwise, it may detect a current value of each phase of the motor 1 from a voltage of a parasitic inductance of a source terminal of each of the switching elements 21, 23 and 25, and detect the operating states of the switching elements 21 to 26 based on these current values. Yet otherwise, it may detect a current value of each phase of the motor 1 by providing a transformer for current detection at each drain terminal of the switching elements 21, 23 and 25, and detect the operating states of the switching elements 21 to 26 based on these current values. That is, the method of detecting the operating states of the switching elements 21 to 26 illustrated in FIG. 1 is merely one example and the operating states of the switching elements 21 to 26 can be detected by other various methods.

Each lookup table in the storage circuit 30*b* stores waveform information of a gate current of each of the switching elements 21 to 26. The selection circuit 30*c* selects one gate current waveform information from the storage circuit 30*b* based on the operating states of the switching elements 21 to 26 detected by the detection circuit 30*a*. The gate current waveform information selected by the selection circuit 30*c* is provided to each of the driving circuits 10*a* to 10*f* of the switching elements 21 to 26. Alternatively, each lookup table in the storage circuit 30*b* may be provided within the driving circuits 10*a* to 10*e*.

The embodiment aims to reduce or eliminate current ringing during switching elements turn-on. The following description will be focused on the switching element 21, and the operation of the driving circuit 10*a* during the switching element 21 turns-on will be described in detail. However, the following description can apply similarly to other switching elements 22 to 26 and driving circuits 10*b* to 10*f*.

Hereinafter, the switching element 21 will be referred to as a "first switching element." In addition, the switching element 22 that constitutes the arm pair of U phase with the first switching element 21 will be referred to as a "second switching element."

Figure 3:
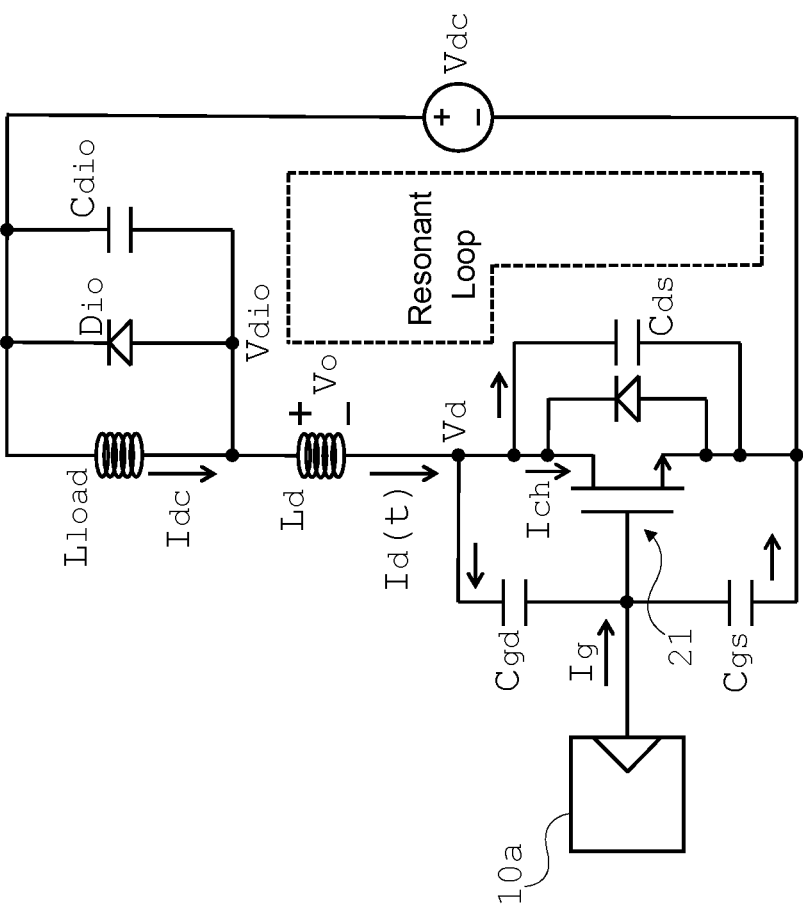

FIG. 3 is an equivalent circuit during the first switching element 21 in FIG. 1 turns-on. In FIG. 1, during the first switching element 21 turns-on, the second switching element 22 is OFF. In FIG. 3, the second switching element 22 which is OFF is represented by a diode Dio and a parasitic capacitor Cdio.

An inductor Lload represents an inductance of the motor 1 that is a load. An inductor Ld represents a parasitic inductance of wiring that connects the drain terminal of the first switching element 21 and the drain terminal of the second switching element 22.

The first switching element 21 has a gate-to-source parasitic capacitor Cgs, a gate-to-drain parasitic capacitor Cgd and a drain-to-source parasitic capacitor Cds. The driving circuit 10*a* outputs a gate current Ig that is a driving current for the first switching element 21.

The following describes an operation during the first switching element 21 driven by the driving circuit 10*a* turns-on, with reference to the equivalent circuit in FIG. 3. Please refer also to the timing chart in FIG. 4. Note that in timing charts in FIG. 4 and subsequent drawings, the drain voltage is indicated by an alternate long and short dash line.

Figure 4:
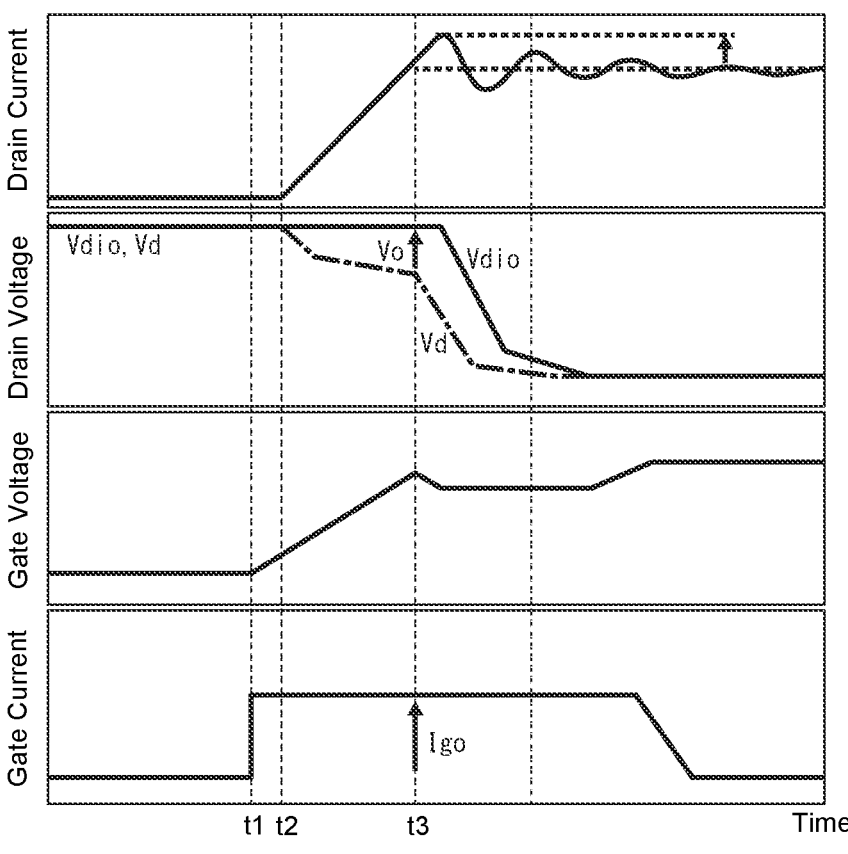

In an initial state at the left end of FIG. 4, the gate current Ig output from the driving circuit 10*a* is 0 and the gate voltage of the first switching element 21 is also 0. Therefore, the first switching element 21 is OFF; the drain current Id is 0; and the drain voltage Vd (indicated by an alternate long and short dash) is equal to a voltage Vdio on the anode side of the diode Dio.

At time t1, the driving circuit 10*a* increases the gate current Ig to Ig0 in a step-like manner. This operation initiates charging of the parasitic capacitor Cgs between the gate and source of the first switching element 21, and the gate voltage of the first switching element 21 increases in a ramp-like manner.

At time t2, the gate voltage of the first switching element 21 exceeds a threshold voltage, then a channel is formed and the drain current Id starts flowing. The drain current Id increases as the gate voltage increases. During this period, the diode Dio is ON and the voltage Vdio on the anode side thereof remains constant. On the other hand, the flowing of the drain current Id generates a voltage across the inductor Ld, which causes the drain voltage Ld to decrease.

At time t3, the drain current Id becomes equal to the DC current Idc flowing through the inductor Lload, which brings the diode Dio into OFF, and the voltage Vdio on the anode side thereof to decrease. At this time, a resonant loop is formed as illustrated in FIG. 3 and ringing of the drain current Id occurs. An equivalent circuit when the resonant loop in FIG. 3 is formed is as illustrated in FIG. 5.

Figure 5:
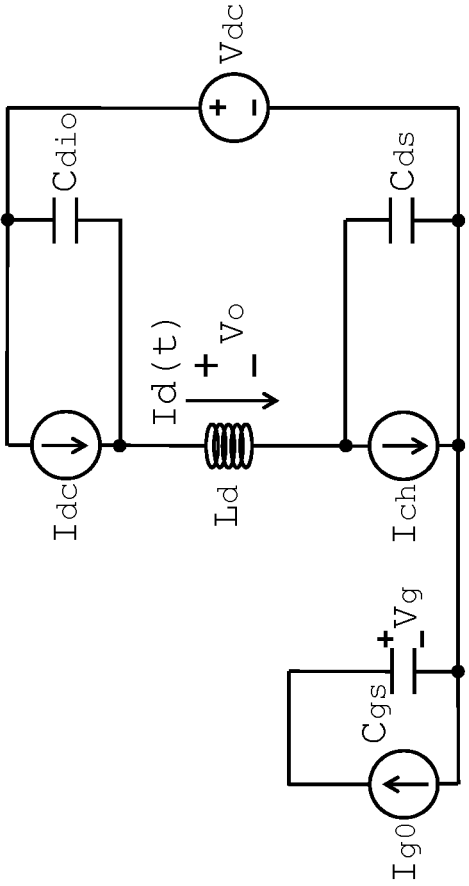
FIG. 5 is an equivalent circuit during a resonant loop in FIG. 3 is formed.

In the equivalent circuit in FIG. 5, a current source Ig0 on the left side represents the gate current at time t3. The current Id(t) is the drain current of the first switching element 21. The voltage Vo is the voltage across the inductor Ld when resonance starts at time t3 and is equal to the difference between the diode voltage Vdio and the drain voltage Vd of the first switching element 21 at time t3 in FIG. 3. In addition, a constant current source Idc in an upper part of FIG. 5 represents a current charged in the inductor Lload in FIG. 3; and a constant current source Ich in a lower part thereof represents a channel current of the first switching element 21.

In the equivalent circuit in FIG. 5, the channel current Ich of the first switching element 21 can be expressed as follows by using a transconductance gm of the first switching element 21, a voltage Vg of the gate-to-source parasitic capacitor Cgs and the current Idc.

$$I_{ch}g_mV_g + I_{dc} \tag{1}$$

The above equation can be expressed as follows by using the voltage Vg of the parasitic capacitor Cgs=(Ig0/Cgs)t.

$$I_{ch} = g_m\left(\frac{I_{g0}}{C_{gs}}\right)t + I_{dc} \tag{2}$$

Let us consider obtaining a time waveform of the drain current Id(t) during the first switching element 21 turns-on from the equivalent circuit in FIG. 5. Here, by using the principle of superposition, the equivalent circuit in FIG. 5 can be divided into an equivalent circuit in FIG. 6A and an equivalent circuit in FIG. 6B.

First, in the equivalent circuit in FIG. 6A, the equation of the drain current Id(t) can be written as in the following equation (3). In the equation, the fact is used that the voltage across the inductor Ld is equal to the product of the differential value of the current Id (t) flowing through the inductor Ld and the inductance Ld. In addition, the equations (4) and (5) are initial conditions for the equation (3).

$$L_d\frac{dI_d(t)}{dt} + \frac{1}{C_{ds}}\int(I_d(t) - I_{dc})dt + \frac{1}{C_{dio}}\int(I_d(t) - I_{dc})dt = V_{dc} \tag{3}$$

$$I_d(0) = I_{dc} \tag{4}$$

$$\frac{dI_d(0)}{dt} = \frac{V_0}{L_d} \tag{5}$$

The solution of the above equation can be obtained as in the following equation (6).

$$I_d(t) = \frac{1}{\omega}\left(\frac{V_0}{L_d}\right)\sin\omega t + I_{dc} \tag{6}$$

$$\omega = \frac{1}{\sqrt{L_dC_{tot}}} \tag{7}$$

$$C_{tot} = \frac{C_{ds}C_{dio}}{C_{ds} + C_{dio}} \tag{8}$$

The first term on the right side of the above equation (6) represents a resonant current that is determined by the voltage Vo across the inductor Ld when the resonance starts; and the amplitude of the resonant current is proportional to the voltage Vo across the inductor Ld when the resonance starts, and is inversely proportional to both an angular frequency co and the inductance Ld. In addition, the second term on the right side represents the DC current flowing through the inductor Ld, which does not contribute to the resonance.

Next, in the equivalent circuit in FIG. 6B, the equation of the drain current Id(t) can be written as in the following equation (9). In addition, equations (10) and (11) are initial conditions for the equation (9).

$$L_d\frac{dI_d(t)}{dt} + \frac{1}{C_{ds}}\int\left(I_d(t) - g_m\left(\frac{I_{g0}}{C_{gs}}\right)t\right)dt + \frac{1}{C_{dio}}\int(I_d(t))dt = 0 \tag{9}$$

$$I_d(0) = 0 \tag{10}$$

$$\frac{dI_d(0)}{dt} = 0 \tag{11}$$

The solution of the above equation can be obtained as in the following equation (12). Note that co and Ctot in the equation are the same as those in the equations (7) and (8).

$$I_d(t) = -\frac{1}{\omega}g_m\left(\frac{C_{tot}I_{g0}}{C_{ds}C_{gs}}\right)\sin\omega t + g_m\left(\frac{C_{tot}I_{g0}}{C_{ds}C_{gs}}\right)t \tag{12}$$

The first term on the right side in the above equation (12) represents a resonant current generated by the gate current Ig0 when the resonance starts, and the phase thereof is deviated by 180 degree from the phase of the first term on the right side of the above equation (6). In addition, the second term on the right side represents a current flowing through the parasitic capacitor Cdio which does not contribute to the resonance.

Figure 6B:
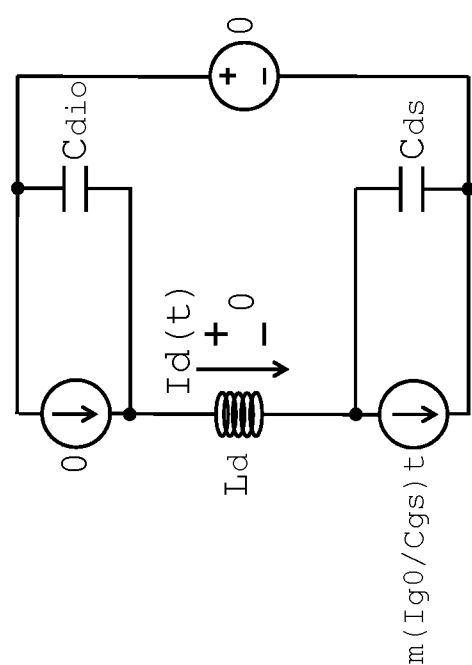
FIG. 6B is another equivalent circuit obtained by dividing the equivalent circuit in FIG. 5 by using the principle of superposition.
Figure 6A:
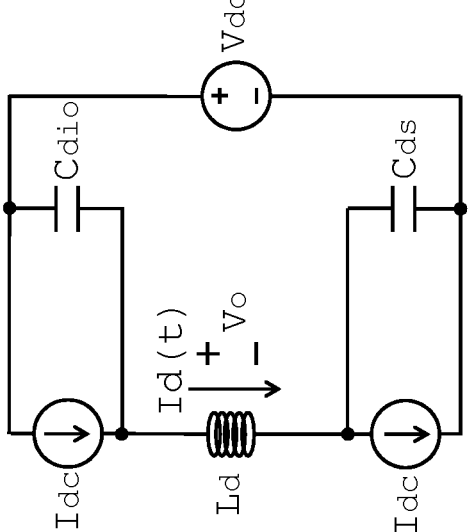
FIG. 6A is one equivalent circuit obtained by dividing the equivalent circuit in FIG. 5 by using the principle of superposition.

The equation (6) that is a solution of the equivalent circuit in FIG. 6A and the equation (12) that is a solution of the equivalent circuit in FIG. 6B are added together and thereby, the solution of the equivalent circuit in FIG. 5, i.e. the time waveform of the drain current Id(t) during the first switching element 21 turns-on, can be obtained.

$$I_d(t) = I_{dc} + \frac{1}{\omega}\left(\frac{V_0}{L_d}\right)\sin\omega t - \frac{1}{\omega}g_m\left(\frac{C_{tot}I_{g0}}{C_{ds}C_{gs}}\right)\sin\omega t + g_m\left(\frac{C_{tot}I_{g0}}{C_{ds}C_{gs}}\right)t \tag{13}$$

From the right side of the above equation (13), it is found that the ringing of the drain current Id(t) during the first switching element 21 turns-on is caused by the resonant currents of the second term and third term on the right side. Especially, the second term on the right side represents a resonant current that is determined by the voltage Vo across the inductor Ld when the resonance starts; and the amplitude thereof is proportional to the voltage Vo across the inductor Ld when the resonance starts, and is inversely proportional to both the angular frequency co and the inductance Ld.

Therefore, a first possible method for reducing or eliminating the ringing of the drain current Id(t) during the first switching element 21 turns-on is to reduce the voltage Vo across the inductor Ld when the resonance starts at time t3 in FIG. 4.

Figure 7:
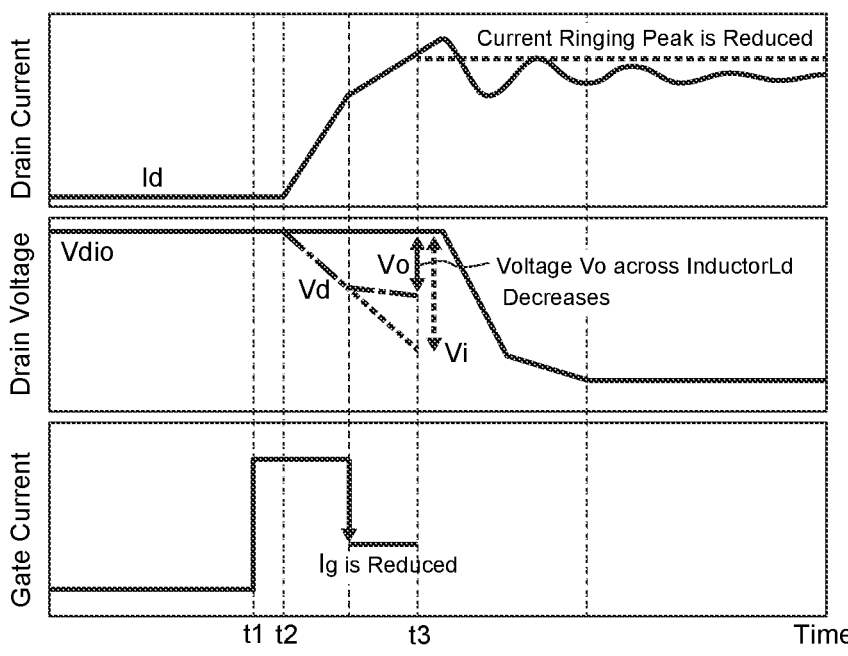
FIG. 7 is a timing chart for describing a first method for reducing or eliminating current ringing.

To achieve this, the driving circuit 10a according to the first embodiment reduces the gate current Ig in a step-like manner immediately before time t3 when the resonance starts, as illustrated in FIG. 7, to reduce the rate of increase of the drain current Id of the first switching element 21 and reduce the rate of change of the current flowing through the inductor Ld, thereby reducing the voltage Vo across the inductor Ld when the resonance starts at time t3. This allows to reduce the amplitude of the resonant current during the first switching element 21 turns-on.

In the above description, the gate current Ig is reduced in a step-like manner "immediately before" time t3 when the resonance starts. However, more generally, the gate current Ig may be reduced in the period between the first time (t3) when the current flowing through the second switching element 22 becomes 0 and the resonant loop is formed and the second time (t2) when the drain current Id of the first switching element 21 starts to increase.

Figure 8:
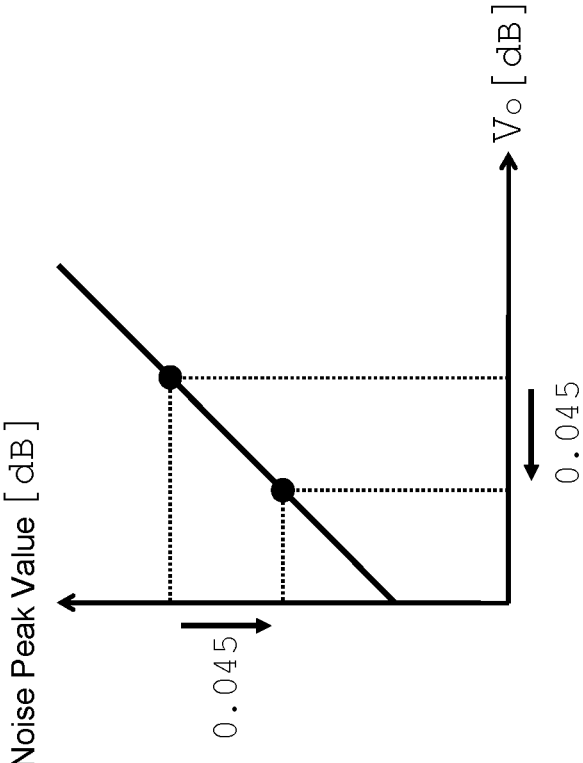
FIG. 8 is a graph for describing the first method for reducing or eliminating current ringing.

As the reduced amount of the gate current Ig increases, the amplitude of the resonant current is reduced accordingly. However, the loss in the switching operation increases. Therefore, the target value for reduction of the gate current Ig may be determined to be, for example, a current value that achieves a desired amount of reduction of the peak value of the noise that is experimentally observed due to the ringing of the drain current Id. More specifically, as described above, the amplitude of the resonant current, which is the second term on the right side of the equation (13), is proportional to the voltage Vo across the parasitic inductor Ld at the first time (t3) when the resonance starts. In addition, to reduce the peak value of the noise by 0.45 dB, for example, as illustrated in FIG. 8, the voltage Vo may be reduced by 0.45 dB. When the voltage Vo is reduced by 0.45 dB, the true value of the voltage Vo (voltage value) is reduced by approximately 5 percent as compared with the voltage Vi when the gate current Ig is not reduced.

Therefore, the target value for reducing the gate current Ig is, for example, a value that causes a reduction by 5 percent of the voltage Vo across the parasitic inductance Ld at the first time (t3) as compared with the case where the gate current Ig is not reduced (Vi).

Next, in comparison between the second term and the third term in the above equation (13), it is found that the phases thereof are deviated from each other by 180 degrees. Therefore, a second possible method for reducing or eliminating the ringing of the drain current Id(t) during the first switching element 21 turns-on is to increase, in a step-like manner, the gate current Ig when the resonance starts at time t3 in FIG. 4 so as to equalize the amplitude of the second term on the right side and the amplitude of the third term on the right side, thereby causing both of them to cancel each other out.

Figure 9:
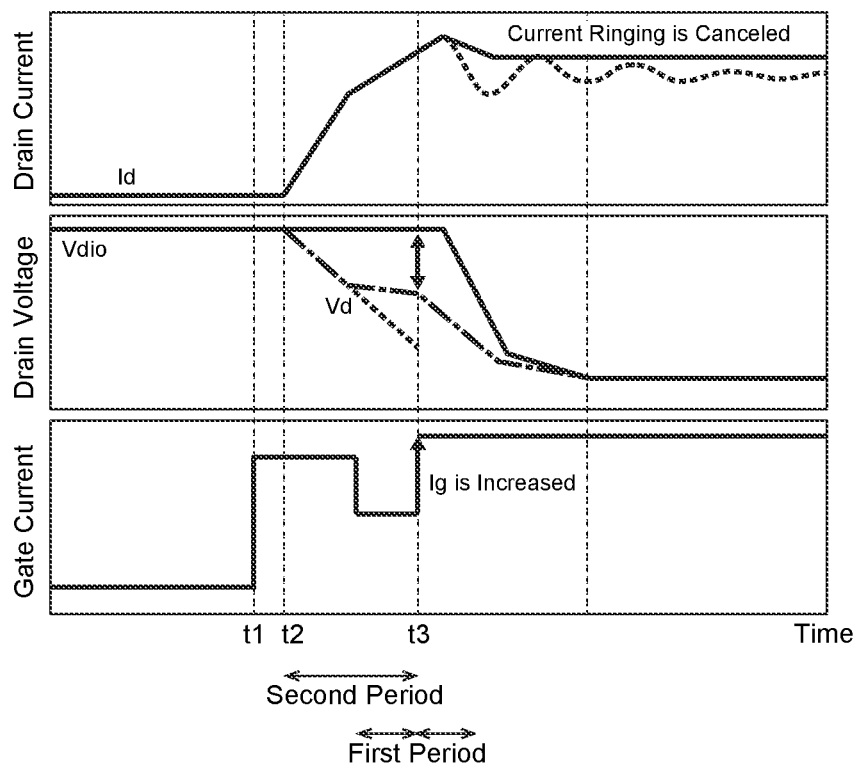
FIG. 9 is a timing chart for describing a second method for reducing or eliminating current ringing.

To achieve this, the driving circuit 10a according to the first embodiment increases the gate current Ig in a step-like manner at time t3 when the resonance starts, as illustrated in FIG. 9. A target value Igsor of the gate current at this time is determined to satisfy the following equation (14) so that both the amplitudes of the second term and third term on the right side of the equation (13) are equal.

$$\frac{1}{\omega}\left(\frac{V_o}{L_d}\right) = \frac{1}{\omega} g_m \left(\frac{C_{tot} I_{gsor}}{C_{ds} C_{gs}}\right) \tag{14}$$

By solving the above equation for the target value Igsor, the following equation (15) can be obtained.

$$I_{gsor} = \frac{C_{ds} C_{gs} V_0}{g_m C_{tot} L_d} \tag{15}$$

As described above, the resonant current during the first switching element 21 turns-on is canceled. Note that most preferably, the timing for increasing the gate current Ig in a step-like manner accurately matches with the time t3. However, it may slightly deviate around time t3. Typically, it is expected to obtain a sufficient effect by increasing the gate current Ig to the target value Igsor in a specific time period according to the first time (t3). The specific period is before or after the first time (t3) at which the current flowing through the second switching element 22 becomes 0 and the resonant loop is formed. An example thereof is a period equal to or shorter than 0.25 times the cycle of the resonant frequency T=2π/ω.

As described above, the switching element driving circuit 10a according to the first embodiment increases the gate current Ig of the first switching element 21, in accordance with the first time (t3) when the current flowing through the second switching element 22 connected to the drain terminal of the first switching element 21 becomes 0.

More specifically, the driving circuit 10a increases the gate current Ig of the first switching element 21 in a first period before or after the first time (t3). The first period is preferably a period equal to or shorter than 0.25 times the cycle of the resonant frequency T=2π/ω that is obtained from the angular frequency co determined by the above equations (7) and (8).

With the above characteristics, the switching element driving circuit 10a according to the first embodiment allows to cancel the resonant current during the first switching element 21 turns-on, thereby reducing or eliminating the ringing of the drain current Id.

Preferably, the driving circuit 10a increases the gate current Ig of the first switching element 21 in a step-like manner in the above first period, and the target value Igsor is determined by the above equation (15). However, it is not necessarily required to strictly correspond to the equation (15), and if it is within the range of about 0.25 to 1.25 times the equation (15), sufficient effects can be expected.

In addition, the switching element driving circuit 10a according to the first embodiment reduces the gate current Ig of the first switching element 21 in a second period between the first time (t3) when the current flowing through the second switching element 22 connected to the drain terminal of the first switching element 21 becomes 0 and the second time (t2) when the drain current Id of the first switching element 21 starts to increase. This allows to reduce the amplitude of the resonant current during the first switching element 21 turns-on, further reducing or eliminating the ringing of the drain current Id.

Preferably, the driving circuit 10a reduces the gate current Ig of the first switching element 21 in a step-like manner in the above second period, and the target value thereof is, for example, a value that allows to reduce the voltage VO across the parasitic inductance Ld at the first time (t3) by a predetermined percentage (e.g., 5 percent) as compared with a case where the gate current Ig is not reduced (Vi).

Figure 10:
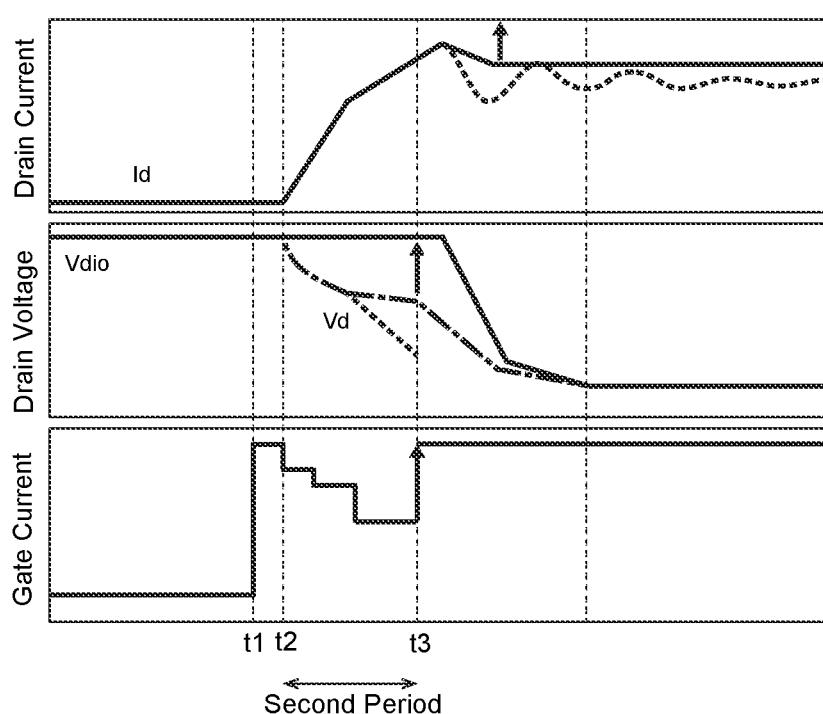
FIG. 10 is a timing chart for describing a modification of the first method for reducing or eliminating current ringing.
Figure 11:
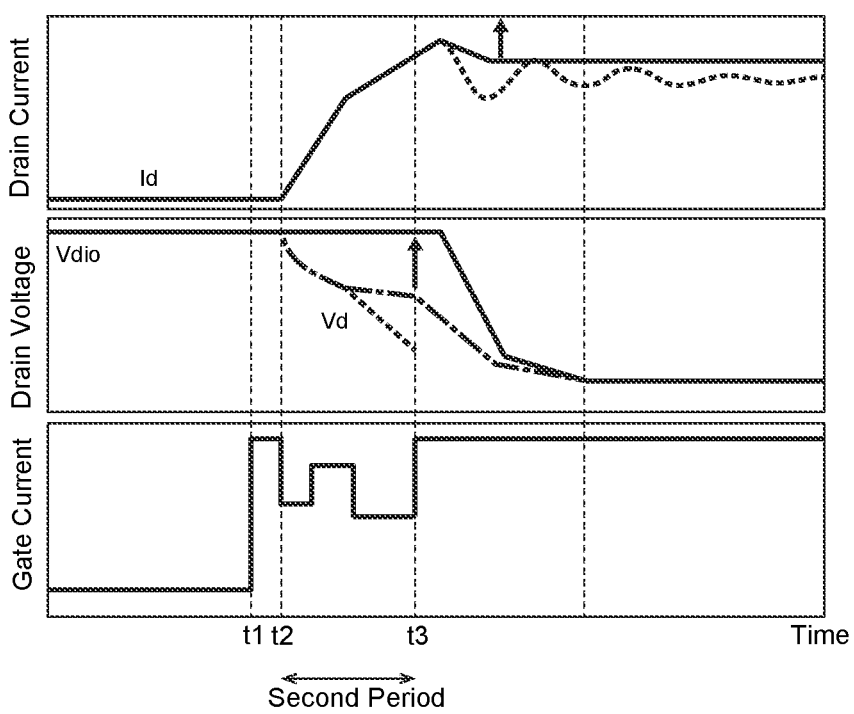
FIG. 11 is a timing chart for describing a modification of the first method for reducing or eliminating current ringing.

The driving circuit 10a may reduce the gate current Ig of the first switching element 21 in a step-like manner over several times in the above second period, as illustrated in FIG. 10. In addition, it may increase the gate current Ig in a step-like manner at least once in reducing the gate current Ig of the first switching element 21 in a step-like manner, as illustrated in FIG. 11. A value of the gate current Ig after being increased may be larger than a value when the second period starts. By providing a plurality of reduction and increase steps as described above, a timing for increasing the gate current Ig at the time (t3) can be finely adjusted.

Figure 12:
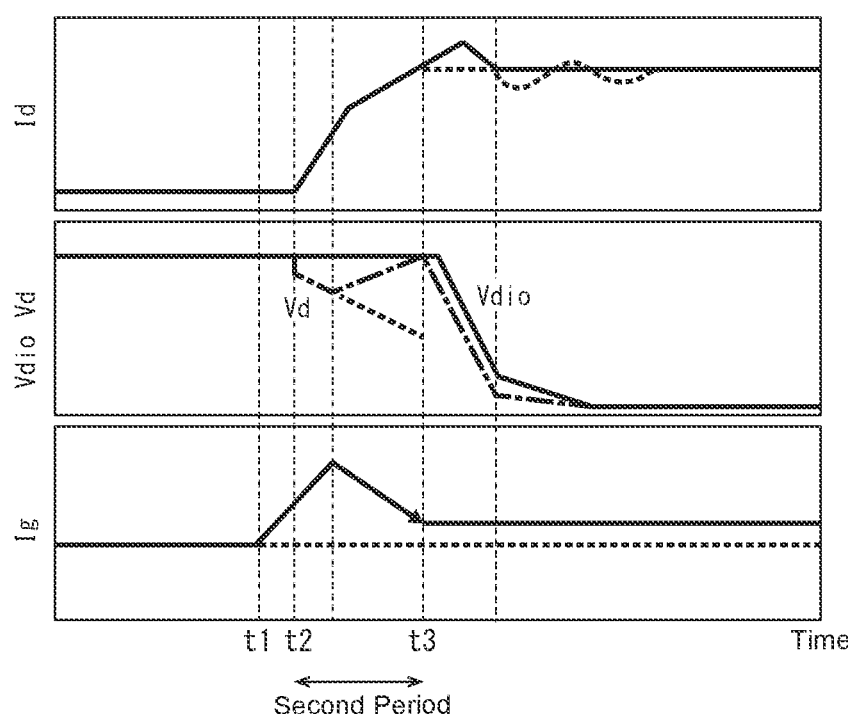
FIG. 12 is a timing chart for describing a modification of the first method for reducing or eliminating current ringing.

In addition, it may set the gate current Ig to a fixed value at the first time (t3) by reducing the gate current Ig of the first switching element 21 in a ramp-like manner in the above second period, as illustrated in FIG. 12. This allows the voltage Vo across the parasitic inductor Ld to be set to almost 0 at the first time (t3). As a result, the amplitude of the resonant current can be significantly reduced. Although the waveform of the drain current Id (t) that flows when the gate current Ig is reduced in a ramp-like manner as described above is strictly different from the waveform represented by the above equation (13), such a behavior was found as a result of analysis by simulation. Thus, reducing the gate current Ig in a ramp-like manner allows the ringing of the drain current Id to be reduced or eliminated. As to the target value for reducing the gate current Ig, the same discussion for the second method, which has been described above, applies.

Figure 13:
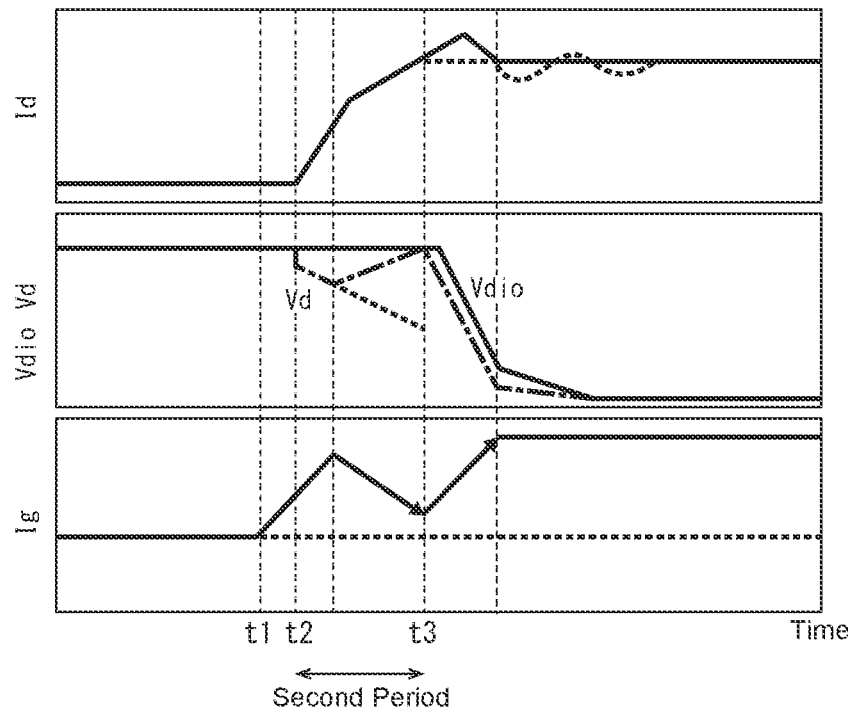
FIG. 13 is a timing chart for describing a modification of the first method for reducing or eliminating current ringing.

In addition, it may increase the gate current Ig in a ramp-like manner after the first time (t3) and then, set it to a fixed value, as illustrated in FIG. 13. It has been found by simulation that when the gate current Ig is increased in a ramp-like manner instead of being increased in a step-like manner after the first time (t3), the resonant current corresponding to the third term on the right side of the above equation (13) does not occur. Therefore, when the gate current Ig is reduced in a ramp-like manner and thereby, the amplitude of the resonant current is sufficiently reduced in the second period, it is effective to increase the gate current Ig in a ramp-like manner instead of a step-like manner after the first time (t3).

Figure 14:
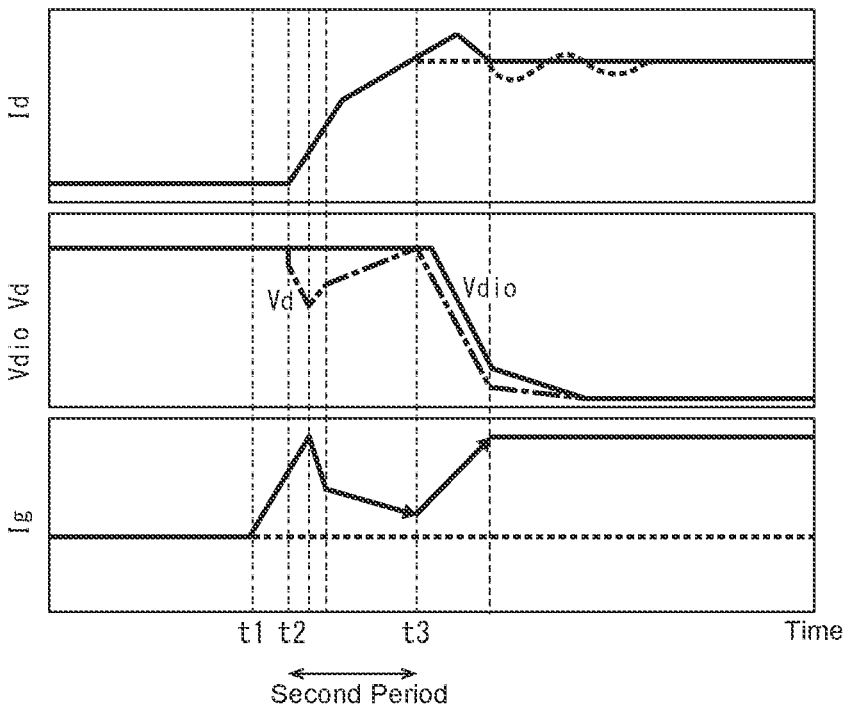
FIG. 14 is a timing chart for describing a modification of the first method for reducing or eliminating current ringing.
Figure 15:
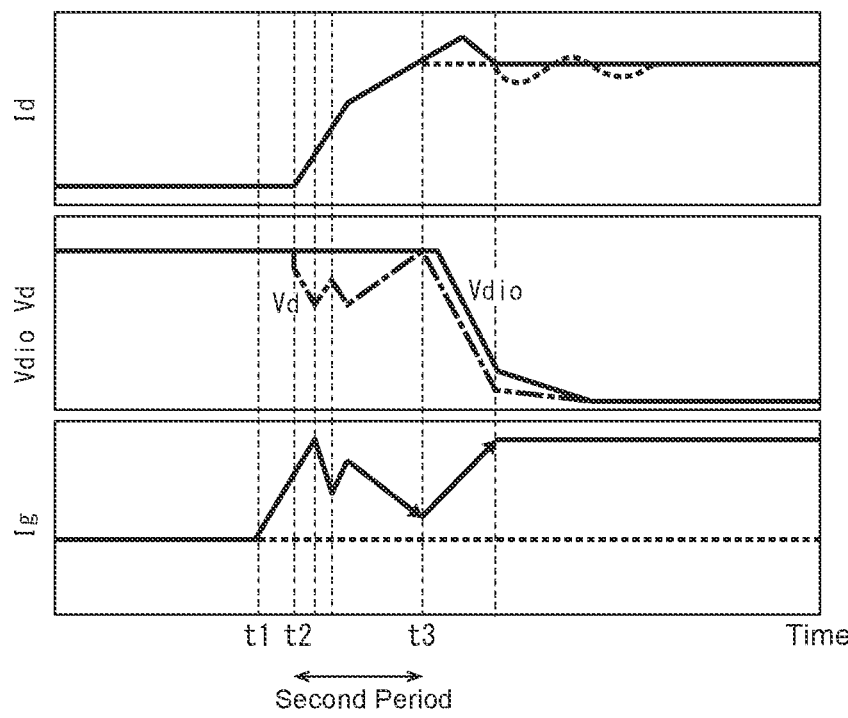
FIG. 15 is a timing chart for describing a modification of the first method for reducing or eliminating current ringing.

In addition, it may reduce the gate current Ig of the first switching element 21 in a ramp-like manner over several times in the second period, as illustrated in FIG. 14. Furthermore, as illustrated in FIG. 15, it may increase the gate current Ig of the first switching element 21 in a ramp-like manner at least once in reducing the gate current Ig in a ramp-like manner in the second period, as illustrated in FIG. 15. The value of the gate current Ig after being increased may be larger than the value when the second period starts.

Modifications

In the above first embodiment, the switching elements 21 to 26 constitute the three-phase inverter circuit 20. Therefore, both the first switching element and the second switching element are N-channel MOSFETs. Instead, for example, when they constitute a converter circuit, the first switching element is an N-channel MOSFET and the second switching element is a diode.

The switching elements 21 to 26 are not limited to MOSFETs. For example, the switching elements 21 to 26 may be IGBTs. In this case, the switching elements 21 to 26 are N-channel IGBTs and the first terminal is a collector terminal, the second terminal is an emitter terminal, and the control terminal is a gate terminal.

In addition, the switching elements 21 to 26 may be bipolar junction transistors (BJT). In this case, the switching elements 21 to 26 are NPN BJTs; and the first terminal is a collector terminal, the second terminal is an emitter terminal, and the control terminal is a base terminal.

Furthermore, the switching elements 21 to 26 can be made of semiconductors using various materials such as silicon (Si), silicon carbide (SiC) or gallium nitride (GaN).

Figures 16A, 16B:
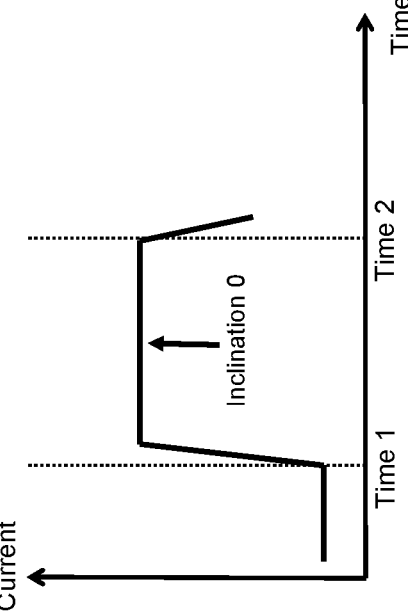
FIG. 16A is a graph for describing the definition of "step-like"
FIG. 16B is a graph for describing the definition of "ramp-like".

Finally, the definitions of "step-like" and "ramp-like" in the embodiment are described. As illustrated in FIG. 16A, a step-like waveform is a waveform that has a zero current slope in a period in an interval between time 1 and time 2 during which a current changes. As illustrated in FIG. 16B, a ramp-like waveform is a waveform that does not have a zero current slope in a period in an interval between time 1 and time 2 during which a current changes. The step-like waveform may be a waveform that has a zero current slope in a predetermined period or longer in an interval between time 1 and time 2 during which a current changes; and the ramp-like waveform may be a waveform that has a zero current slope in a period shorter than a predetermined period in an interval between time 1 and time 2 during which a current changes. In addition, the zero current slope includes not only a strictly zero one but also a slope in the range of being considered to be a zero one in driving a switching element.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Above embodiments can be described as follows:

[1] An electronic circuitry comprising:

a driving circuit configured to:

supply a driving current to a control terminal of a first switching element; and increase the driving current in accordance with a first time, the first time being when a current flowing through a second switching element becomes 0, the second switching element being connected to a first terminal or a second terminal of the first switching element.

[2]. The electronic circuitry according [1], wherein the driving circuit increases the driving current of the first switching element in a first period according to the first time, the first period being before or after the first time, and the first period is determined based on a parasitic capacitance of the first switching element, a parasitic capacitance of the second switching element and a parasitic inductance of wiring that connects the first switching element and the second switching element.

[3] The electronic circuitry according to [1] or [2], wherein the driving circuit increases the driving current of the first switching element in a step-like manner in the first period, and a target value of the driving current is determined based on:

a drain parasitic capacitance of the first switching element;

a gate parasitic capacitance of the first switching element;

a transconductance of the first switching element;

the parasitic inductance of the wiring that connects the first switching element and the second switching element; and a voltage across the parasitic inductance at the first time.

[4] The electronic circuitry according to any one of [1] to [3], wherein the driving circuit reduces the driving current of the first switching element in a second period, the second period being between the first time and a second time, the second time being when a current flowing through the first switching element starts to increase.

[5]. The electronic circuitry according to [4], wherein the driving circuit reduces the driving current of the first switching element in a step-like manner in the second period, and a target value of the driving current is a value that causes the voltage across the parasitic inductance at the first time to be reduced by a predetermined percentage in comparison with a case where the driving current is not reduced.

[6] The electronic circuitry according to [5], wherein the driving circuit reduces the driving current of the first switching element in a step-like manner over a plurality of times in the second period.

[7] The electronic circuitry according to [5] or [6], wherein the driving circuit increases the driving current of the first switching element in a step-like manner at least once in reducing the driving current in a step-like manner in the second period.

[8] An electronic circuitry, comprising:
a driving circuit configured to:
supply a driving current to a control terminal of a first switching element; and
reduce the driving current of the first switching element in a second period between a first time and a second time, the first time being when a current flowing through a second switching element becomes 0, the second switching element being connected to a first terminal or a second terminal of the first switching element, the second time being when a current flowing through the first switching element starts increasing.

[9] The electronic circuitry according to [8], wherein the driving circuit reduces the driving current of the first switching element in a step-like manner in the second period, and
a target value of the driving current is a value that causes a voltage across a parasitic inductance of wiring at the first time to be reduced by a predetermined percentage in comparison with a case where the driving current is not reduced, the wiring connecting the first switching element and the second switching element.

[10]. The electronic circuitry according to [8], wherein the driving circuit reduces the driving current of the first switching element in a step-like manner over a plurality of times in the second period.

[11] The electronic circuitry according to [9] or [10], wherein
the driving circuit increases the driving current of the first switching element in a step-like manner at least once in reducing the driving current in a step-like manner in the second period.

[12] The electronic circuitry according to [8], wherein the driving circuit reduces the driving current of the first switching element in a ramp-like manner in the second period and sets the driving current to a fixed value at the first time.

[13] The electronic circuitry according to [12], wherein a target value of the driving current is a value that causes a voltage across a parasitic inductance of wiring at the first time to be reduced by a predetermined percentage in comparison with a case where the driving current is not reduced, the wiring connecting the first switching element and the second switching element.

[14] The electronic circuitry according to [13], wherein the driving circuit increases the driving current in a ramp-like manner after the first time and then, sets the driving current to a fixed value.

[15] The electronic circuitry according to any one of [12] to [14], wherein
the driving circuit reduces the driving current of the first switching element in a ramp-like manner over a plurality of times in the second period.

[16] The electronic circuitry according to any one of [12] to [15], wherein
the driving circuit increases the driving current of the first switching element in a ramp-like manner at least once in reducing the driving current in a ramp-like manner in the second period.

[17] A electronic system, comprising:
the electronic circuitry according to any one of [1] to [16]; and
a control circuit configured to provide waveform information of the driving current to the driving circuit of the electronic circuitry, wherein
the driving circuit generates the driving current based on the waveform information.

[18] The electronic system according to [17], wherein the control circuit includes:
a detection circuit configured to detect an operating state of the first switching element;
a storage device configured to store a plurality of waveform information of the driving current; and
a selection circuit configured to select one waveform information of the driving current from the storage device, based on the operating state of the first switching element, the operating state being detected by the detection circuit.

[19] The electronic system according to [18], comprising:
the first switching element.

[20] The electronic system according to [18], further comprising:
a power conversion circuit that includes an arm pair constituted by the first switching element and the second switching element.

The invention claimed is:
1. An electronic circuitry comprising:
a driving circuit configured to:
supply a driving current to a control terminal of a first switching element; and
increase the driving current in accordance with a first time, the first time being when a current flowing through a second switching element becomes 0, the second switching element being connected to a first terminal or a second terminal of the first switching element, wherein
the driving circuit increases the driving current of the first switching element in a first period according to the first time, the first period being before or after the first time, and
the first period is determined based on a parasitic capacitance of the first switching element, a parasitic capacitance of the second switching element and a parasitic inductance of wiring that connects the first switching element and the second switching element.

2. The electronic circuitry according to claim 1, wherein the driving circuit increases the driving current of the first switching element in a step-like manner in the first period, and
a target value of the driving current is determined based on:
a drain parasitic capacitance of the first switching element;
a gate parasitic capacitance of the first switching element;
a transconductance of the first switching element;
the parasitic inductance of the wiring that connects the first switching element and the second switching element; and a voltage across the parasitic inductance at the first time.

3. The electronic circuitry according to claim 1, wherein the driving circuit reduces the driving current of the first switching element in a second period, the second period being between the first time and a second time, the second time being when a current flowing through the first switching element starts to increase.

4. The electronic circuitry according to claim 3, wherein the driving circuit reduces the driving current of the first switching element in a step-like manner in the second period, and a target value of the driving current is a value that causes the voltage across a parasitic inductance of wiring that connects the first switching element and the second switching element at the first time to be reduced by a predetermined percentage in comparison with a case where the driving current is not reduced.

5. The electronic circuitry according to claim 4, wherein the driving circuit reduces the driving current of the first switching element in a step-like manner over a plurality of times in the second period.

6. The electronic circuitry according to claim 4, wherein the driving circuit increases the driving current of the first switching element in a step-like manner at least once in reducing the driving current in a step-like manner in the second period.

7. An electronic system, comprising:
the electronic circuitry according to claim 1; and
a control circuit configured to provide waveform information of the driving current to the driving circuit of the electronic circuitry, wherein
the driving circuit generates the driving current based on the waveform information.

8. The electronic system according to claim 7, wherein the control circuit includes:
   a detection circuit configured to detect an operating state of the first switching element;
   a storage device configured to store a plurality of waveform information of the driving current; and
   a selection circuit configured to select one waveform information of the driving current from the storage device, based on the operating state of the first switching element, the operating state being detected by the detection circuit.

9. An electronic circuitry, comprising:
a driving circuit configured to:
   supply a driving current to a control terminal of a first switching element; and
   reduce the driving current of the first switching element in a second period between a first time and a second time, the first time being when a current flowing through a second switching element becomes 0, the second switching element being connected to a first terminal or a second terminal of the first switching element, the second time being when a current flowing through the first switching element starts increasing, wherein
the driving circuit reduces the driving current of the first switching element in a step-like manner in the second period, and
a target value of the driving current is a value that causes a voltage across a parasitic inductance of wiring at the first time to be reduced by a predetermined percentage in comparison with a case where the driving current is not reduced, the wiring connecting the first switching element and the second switching element.

10. The electronic circuitry according to claim 9, wherein the driving circuit reduces the driving current of the first switching element in a step-like manner over a plurality of times in the second period.

11. The electronic circuitry according to claim 9, wherein the driving circuit increases the driving current of the first switching element in a step-like manner at least once in reducing the driving current in a step-like manner in the second period.

12. The electronic circuitry according to claim 9, wherein the driving circuit reduces the driving current of the first switching element in a ramp-like manner in the second period and sets the driving current to a fixed value at the first time.

13. The electronic circuitry according to claim 12, wherein
a target value of the driving current is a value that causes a voltage across a parasitic inductance of wiring at the first time to be reduced by a predetermined percentage in comparison with a case where the driving current is not reduced, the wiring connecting the first switching element and the second switching element.

14. The electronic circuitry according to claim 13, wherein
the driving circuit increases the driving current in a ramp-like manner after the first time and then, sets the driving current to a fixed value.

15. The electronic circuitry according to claim 12, wherein
the driving circuit reduces the driving current of the first switching element in a ramp-like manner over a plurality of times in the second period.

16. The electronic circuitry according to claim 12, wherein
the driving circuit increases the driving current of the first switching element in a ramp-like manner at least once in reducing the driving current in a ramp-like manner in the second period.

17. An electronic system, comprising:
the electronic circuitry according to claim 9; and
a control circuit configured to provide waveform information of the driving current to the driving circuit of the electronic circuitry, wherein
the driving circuit generates the driving current based on the waveform information.

18. The electronic system according to claim 17, wherein the control circuit includes:
   a detection circuit configured to detect an operating state of the first switching element;
   a storage device configured to store a plurality of waveform information of the driving current; and
   a selection circuit configured to select one waveform information of the driving current from the storage device, based on the operating state of the first switching element, the operating state being detected by the detection circuit.

* * * * *